US005544249A

United States Patent [19]
Opitz

[11] Patent Number: 5,544,249
[45] Date of Patent: Aug. 6, 1996

[54] METHOD OF SIMULATING A ROOM AND/OR SOUND IMPRESSION

[75] Inventor: Martin Opitz, Vienna, Austria

[73] Assignee: AKG Akustische U. Kino-Geräte Gesellschaft m.b.H., Wien, Germany

[21] Appl. No.: 293,134

[22] Filed: Aug. 19, 1994

[30] Foreign Application Priority Data

Aug. 26, 1993 [GB] United Kingdom ............. 43 28 620.8

[51] Int. Cl.[6] ................................ H03G 3/00; H04S 1/00
[52] U.S. Cl. ................................................ 381/63; 381/61
[58] Field of Search ............................. 381/61-64, 17-18

[56] References Cited

U.S. PATENT DOCUMENTS

| | | | |
|---|---|---|---|
| 5,123,050 | 6/1992 | Serikawa et al. | 381/61 |
| 5,131,051 | 6/1992 | Kishinaga et al. | 381/64 |
| 5,142,586 | 8/1992 | Berkhout | 381/63 |
| 5,201,005 | 4/1993 | Matsushita et al. | 381/63 |
| 5,261,005 | 11/1993 | Masayuki | 381/63 |
| 5,305,386 | 4/1994 | Yamato | 381/63 |
| 5,381,482 | 1/1995 | Matsumoto et al. | 381/63 |

FOREIGN PATENT DOCUMENTS

| | | |
|---|---|---|
| 394650 | 11/1990 | Austria . |
| 0505949 | 9/1992 | European Pat. Off. . |

*Primary Examiner*—Stephen Brinich
*Attorney, Agent, or Firm*—Friedrich Kueffner

[57] ABSTRACT

A method of simulating a room impression and/or sound impression occurring at a representative listening location in a room with monophonic, stereophonic or multichannel reproduction includes selecting a room whose sound is to be simulated. A location of a representative listening location is then determined. Subsequently, the corresponding room impulse response at least for one channel is determined at the representative listening location. A threshold value which exceeds over at least a portion of the duration of the determined room impulse response is determined for the determined room impulse response. By comparing the determined room impulse response with the threshold value, a reduced room impulse response is produced which within the portion of the duration of the determined room impulse response only includes those contents of the determined room impulse response in which a momentary amplitude is above the threshold value. The reduced impulse response to the value zero for those contents of the determined room impulse response whose momentary amplitude is below the threshold value is set. Outside of the portion of the duration of the determined room impulse response, the reduced room impulse response contains the determined room impulse response in unchanged form.

14 Claims, 10 Drawing Sheets

METHOD OF SIMULATING A ROOM AND/OR SOUND IMPRESSION

BACKGROUND OF THE INVENTION

1. Field of the Invention

The present invention relates to a method of producing a room impression and/or sound impression of an actually existing room or of a calculated room, wherein any monophonic, stereophonic or multichannel audio program can be used as the auditory program. The reproduction is effected preferably binaurally through headsets; however, the reproduction can also be carried out through loudspeakers. The present invention also relates to an electroacoustic apparatus for carrying out the method.

2. Description of the Related Art

Generally, any produced audio program contains the architectural or room acoustics present during the recording. However, in the previously known stereophonic reproduction methods, the acoustics could never be completely recognizably reproduced in its fine structure. During the reproduction, the listener could not recognize more than that the recording was created in a room with a certain reverberation. Only additional measures with appropriate electroacoustic apparatus were capable of producing better auditory conditions, so that the listener could also recognize the room of the program recording.

For example, a simulation of room-acoustic events which is true to the original can be carried out by folding any selected audio program with the binaural room impulse response, measured at a certain location of reception in a room. Binaural room impulse response is considered to be two impulse responses, wherein one impulse response is assigned to one ear and the other impulse response is assigned to the other ear. In accordance with findings from system theory, the room forms together with the reception characteristics of the human ear a linear causal two part system which is described in the time domain by the room impulse responses. The respective room impulse response is approximately the system response to a sound impulse whose duration is a period of the double upper limit frequency of the audio signal. Convolving any audio program with the binaural room impulse response results in the signal which is suitable for electroacoustic reproduction, wherein the signal is formed in such a way that, with correct sound reproduction at both ears of a listener, an auditory experience is created in the listener as it would be experienced by the same listener at the original listening location at which the actual room acoustic event takes place. As a result, it becomes impossible to the listener to differentiate as to whether the auditory experience perceived by the listener takes place at the location of the actual sound event or whether it is produced by the simulation method. If loudspeakers are used for reproduction instead of headsets, the transmission paths between the loudspeakers and the ears of the listener must be reproduced essentially in the same manner.

A simulation method of this type which unmistakably precisely simulates to the listener the time-related, spectral, spatial and dynamic sound field structures which actually exist at the original listening location, is extremely complicated, particularly as far as the technical apparatus required for the simulation is concerned. Generally, convolution is carried out in such a way that the audio signal and the room pulse responses are digitalized, the convolved signal is calculated in a computer and is converted back into the analog signal. The number of calculation steps depends on the duration of the impulse responses. For example, in the case of an audio signal bandwidth of 20 kHz, a sampling frequency of approximately 50 kHz and, thus, a sampling interval of 20 μsec are necessary and, therefore, $\mathbf{10^5}$ samples are required for a typical room impulse response duration of 2 sec and, when convolving an audio signal with this room impulse response, $5\times10^4\times10^5=5\times10^9$ multiplications and additions must be carried cut per second. This means that the apparatus required for convolving with an audio signal must be extremely large, particularly if the entire sequence of the method is to be carried out in real time. Accordingly, the use of such a simulation method outside of the realm of research is inconceivable for reasons of economy and expense.

An electroacoustic arrangement for a simulation which is virtually true to the original of an auditory situation existing at a certain listening location, is described in Austrian Patent 394,650 for the reproduction of stereophonic binaural audio programs by means of headsets. The auditive truth to the original and also the correct localization of certain sound sources distributed in the room can be ensured by correctly presenting a sound, which was originally recorded for the stereophonic loudspeaker reproduction for a virtually true headset reproduction if, in addition to the directly arriving audio signals of the two channels on the left and right, additionally the room reflections of the listening room are imitated, however, with the room reflections being weighted with the head related transfer functions which are dependent on the direction. The integration of the head related transfer function over all spatial directions results in an approximately flat amplitude frequency response at the ear. Since such a complex reproduction is practically impossible, a simplified configuration must be used. In this significantly simplified configuration, only three different audio signals must be presented to each ear for ensuring a true listening event.

The simulation of room-acoustic events can be carried out very generally by means of a method as it is known, for example, from European application 0 505 949. In this method, a transfer function is simulated by means of a transfer function simulator. This transfer function simulator is equipped with sound sources arranged in an acoustic system, sound receiving units and units for measuring the acoustic transfer function. For measuring the acoustic transfer function, the multitude of possible different positions between two arbitrary points in the acoustic system may be taken into consideration. The simulator proper is characterized in that means for estimating the poles present in the existing transfer function are provided, wherein the AR coefficients which correspond to the physical poles of the acoustic system are estimated from the multitude of measured transfer functions, and the ARMA filters, which are composed of AR filters and filters, reproduce that which coincides from the multitude of measured acoustic transfer functions with the acoustic system. This extremely complicated method has the purpose of reproducing an acoustic transfer function as it is required for echo cancelling units, for anti-reverberation units, for the active wind noise compensation and also for sound localization. The simulation of the transfer characteristics is carried out by a signal processor. In the simulation method itself, the transfer function is simulated with little calculation effort in the consequently shortest possible calculation time.

After appropriate modifications, the simulation method just described could essentially also be used for realizing the true reproduction of room-acoustic events. However, it would be technically extremely complicated and too specific, so that for the useful and economical use of this method there is no particular interest.

The known fast convolution by means of discrete Fourier transformation also does not offer a suitable solution for an economical unit for the simulation of room-acoustic events. This is because of the time delay between source signal and convolved signal which is inherent to this method.

SUMMARY OF THE INVENTION

Therefore, it is the primary object of the present invention to provide a simulation method with the electroacoustic apparatus required for this purpose, which is simplified as compared to known methods, so that the realization of the method is technically and economically feasible.

In accordance with the present invention, the above object is met by a method which includes the steps of:

selecting a room whose sound is to be simulated;

determining within the room the location of a representative listening location;

determining at the representative listening location the corresponding room impulse response at least for one channel;

determining for the determined room impulse response a threshold value which extends over at least a portion of the duration of the determined room impulse response; and by comparing the determined room impulse response to the threshold value, producing a reduced room impulse response which within the portion of the duration of the determined room impulse response only includes those contents of the determined room impulse response in which the momentary amplitude is above the threshold value, while setting the reduced room impulse response to the value zero for those portions of the determined room impulse response whose momentary amplitude is below the threshold value, and which outside of the portion of the duration of the determined room impulse response contains the determined room impulse response in unchanged form.

Because the method according to the present invention selects certain portions from the room impulse responses, the volume of calculations is reduced accordingly since no calculations must be carried out for the omitted portions of the room impulse responses.

The novel simulation method has the advantage that the simulation quality is not reduced even though necessary computational power is severely reduced. In addition, simplified FIR filter structures can be used for convolution. The convolution process takes place without detectable time delay in real time.

Accordingly, the gist of the present invention resides in that a successful true simulation can be carried out with certain portions of the room impulse responses. It is merely necessary to know those portions of the room impulse responses which in accordance with a critical selection are essential for the auditory impression. The knowledge concerning the respective room impulse responses can be obtained by real room-acoustic measurements or model calculation of existing or virtual rooms. The decision concerning which portions are omitted from the room impulse response is made in accordance with auditory psychological principles.

A significant embodiment of the method according to the present invention provides for comparing the values of the room impulse response with a time-dependent threshold value and using only those values of the room impulse responses which exceed the threshold value. Relative to the room impulse response, the threshold value is time-dependent since it has its greatest value in the range of the beginning of the room impulse response and dies down toward the end of the room impulse response. Consequently, significant portions of the room impulse responses become zero.

The advantage of such a division is the fact that the calculation effort for the simulation processor is significantly reduced. The portion of the room impulse response including the direct sound must be combined with the portion containing the reverberation in such a way that the original quality is maintained in the simulation.

In that manner, only those portions are used for the convolution process which contribute significantly to the true simulation. All other portions of the room impulse response no longer appear as a result of being set to zero and no calculations are required for these portions. The FIR filter used for convolution does not have to have a complicated structure and the computational power of the signal processor does only have to be used when coefficients appear which differ from zero. This procedure reduces the calculation effort significantly as compared to conventional convolution and reduction factors of between 10 and 100 can be achieved. Nevertheless, the reverberation time is maintained for room-acoustic events simulated in this manner; with a total duration of the reduced impulse response of only 10 milliseconds, reverberation times which are between 100 to 1,000 milliseconds are simulated without problems. The spatial simulation is not subject to coincidence.

The above-described method, and the electroacoustic apparatus for carrying out the method, can also be configured in such a way that the critical selection of significant portions for maintaining the true simulation is effected by taking into consideration the psychoacoustic forward-masking and backward-masking phenomena in the room impulse response. The masking phenomena known in acoustics have the effect that in the presence of sound, another second sound can only be heard if its excitation in the human ear exceeds that of the first sound. This creates a displacement of the audibility threshold which is imitated by the above-described time-dependent threshold value, so that sound below this threshold is not perceived.

The combination of the two method sequences mentioned and described above is the optimum embodiment of the method according to the present invention. The yield is the greatest possible in relation to the calculation effort and the use of technical equipment, and the obtained result is the most economical.

The simulation method according to the invention will be used particularly in the fields of Hi-Fi recordings and sound studios because that is where the advantages of binaural listening are for the headset reproduction as well as for loudspeaker reproduction. The apparatus according to the invention provides that degree of good and true room acoustics which cancels out the known disadvantages of listening in an anechoic chamber, while not harmfully superimposing the acoustics provided by the recording. The simulation of, for example, a certain loudspeaker arrangement in a certain room by means of headset reproduction is a significant use of the simulation method and of the electroacoustic apparatus required for carrying out the method.

The various features of novelty which characterize the invention are pointed out with particularity in the claims annexed to and forming a part of the disclosure. For a better understanding of the invention, its operating advantages, specific objects attained by its use, reference should be had to the drawing and descriptive matter in which there are illustrated and described preferred embodiments of the invention.

DETAILED DESCRIPTION OF THE PREFERRED EMBODIMENTS

Figure 1A:
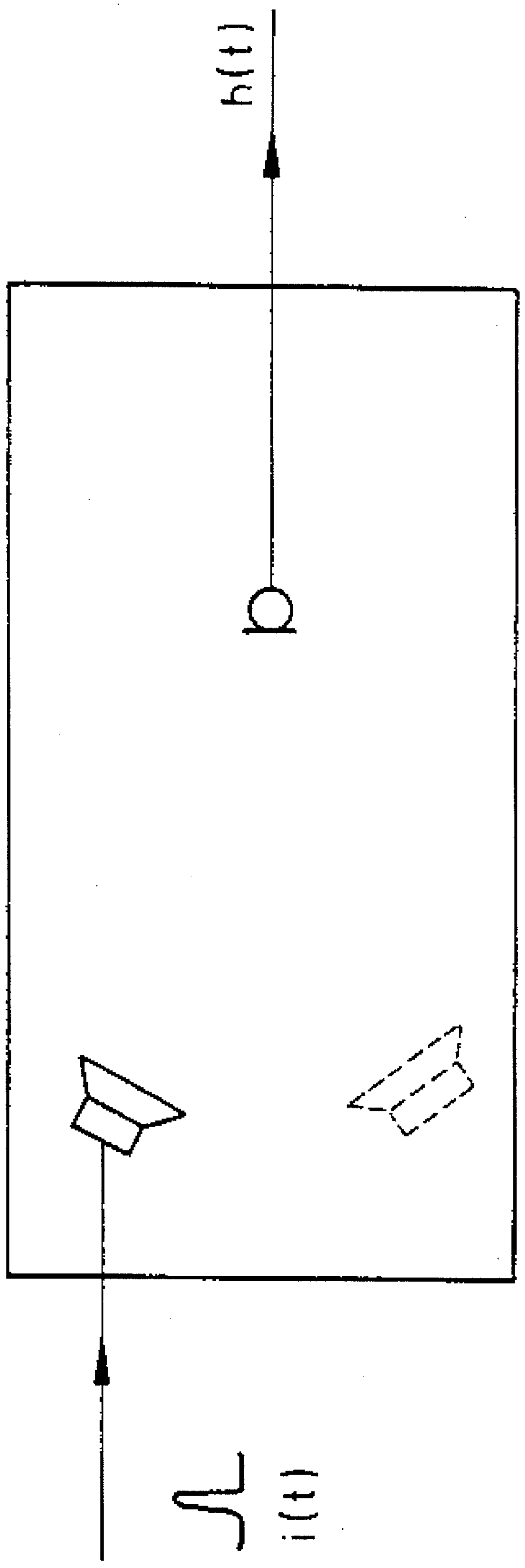
FIG. 1*a* is a schematic illustration of the apparatus according to the invention shown during the measurement of the room impulse response.

FIG. 1*a* of the drawing shows a possible method of determining the room impulse response. A measuring signal is radiated at the location of the sound source and is received at the listening location by means of a measuring microphone. The room impulse response is obtained from the received signal. If an impulse is used as the measuring signal whose duration is equal to a period of the double frequency of the upper frequency limit of the audio signal range, the received signal is equal to the room impulse response h(t). Since the signal-to-noise ratio is low in this method, a longer measuring signal is preferred in the practical application and the room impulse response is determined by calculation.

The binaural room pulse response which is required for the reproduction through headsets is obtained by placing the measuring microphones into the auditory meatuses of a test person for whom the room impulse response is to be determined. Subsequently, the impulse response for the system loudspeaker-room-ear is measured and then the impulse response for the system headset-ear is measured. The obtained impulse responses are transformed into the frequency domain, the transformed functions are divided and the quotient is retransformed into the time domain. When this procedure is carried out for both ears, a binaural room impulse response is obtained which is composed of a right room impulse response and a left room impulse response.

Figure 1B:
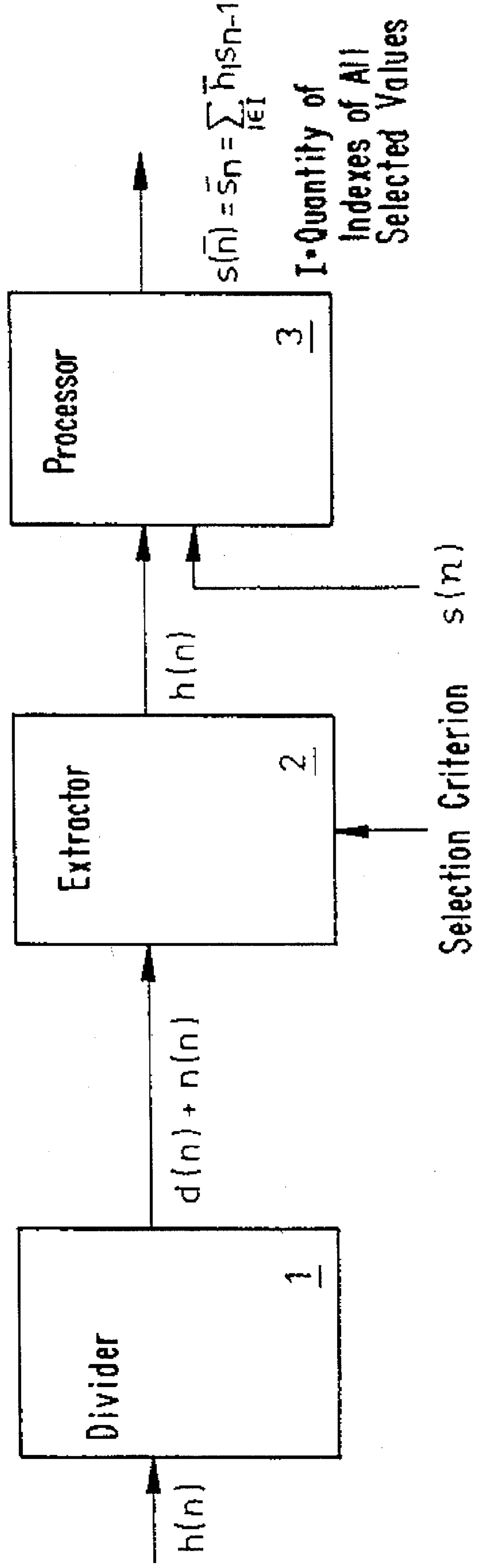
FIG. 1*b* is a diagram of an electroacoustic apparatus for producing and convolving the reduced room impulse response.

FIG. 1*b* of the drawing is a diagram showing the sequence of method steps in one of the two room impulse responses determined as described above. The room impulse response h(t) is conducted to the divider 1 in order to carry out the division into the direct sound content d(t) and the reverberation content r(t). The reverberation content r(t) also includes all individual reflections of the measuring signal emanating from the room walls.

The room impulse response is by nature a continuous time signal and is digitalized for processing, so that h(t), d(t) or r(t) become h(n), d(n) or r(n), respectively. Since digital processing in digital filters used in this case requires a discrete-time representation, the discrete-time representation h(n) is exclusively used in the figures of the drawing, wherein n is the travel index for the samples which is coupled to time through $t=n\ \tau$ and $\tau$ is the period duration of the sampling frequency. However, for reasons of clarity, the representation in the figures is only as a continuous function.

Figure 4A:
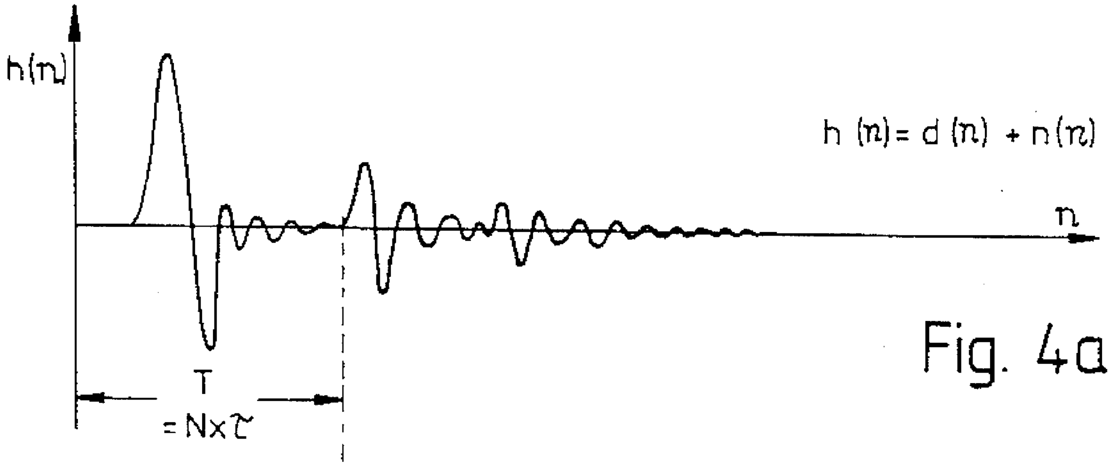
FIG. 4*a* is a diagram of a simple determined room impulse response.
Figure 4B:
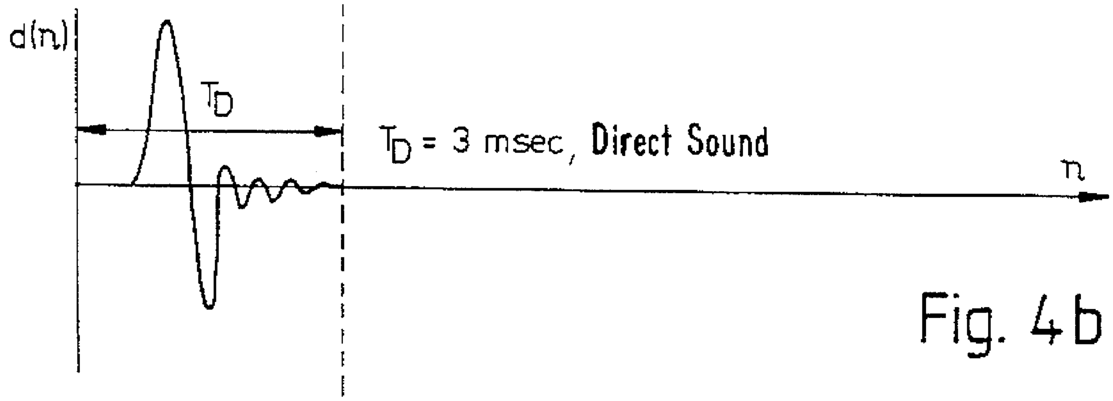
FIG. 4*b* is a diagram showing the portion of the direct sound of the determined room impulse response according to FIG. 4*a;*
Figure 4C:
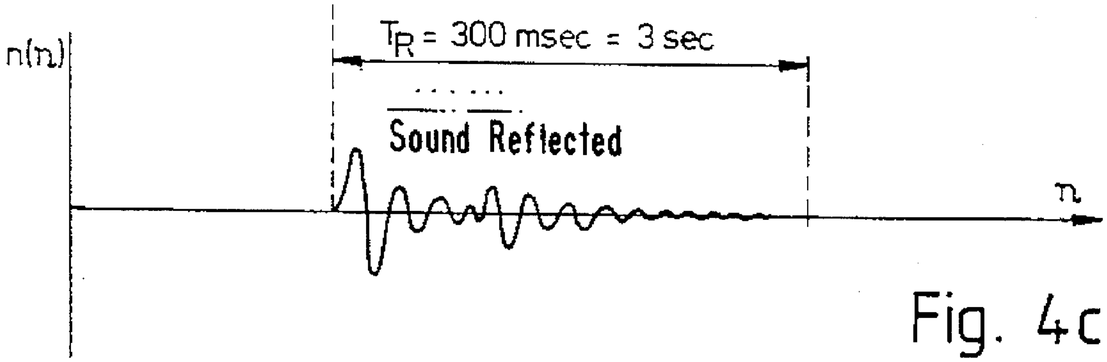
FIG. 4*c* is a diagram showing to reflected sound portions from the determined room impulse response according to FIG 4*a;*
Figures 5A, 5B, 5C, 5D, 5E:
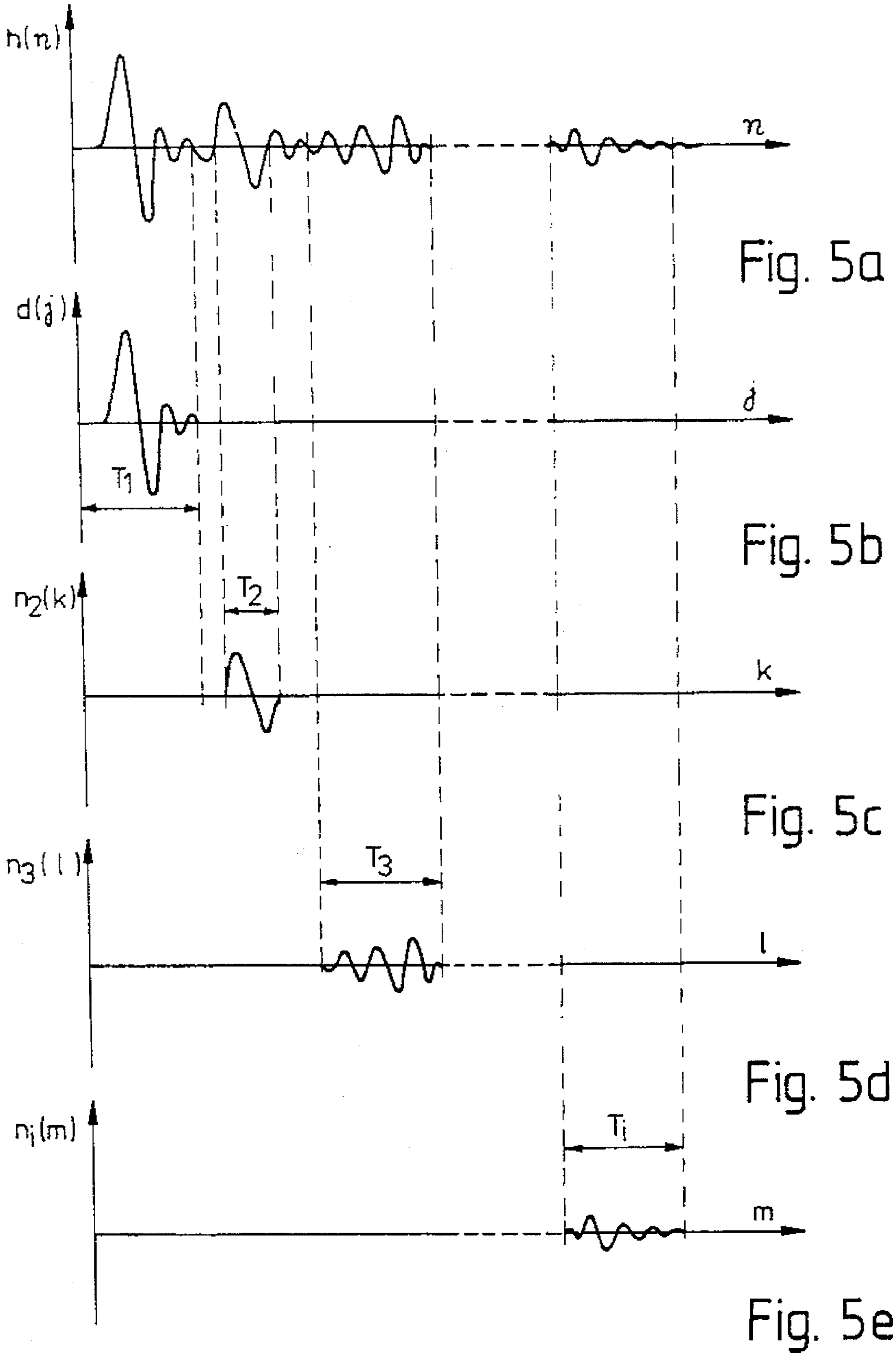
FIG. 5*a* is a diagram showing a simplified determined room impulse response.
FIG. 5*b* is a diagram showing the portion of the direct sound of the determined room pulse response according to FIG. 5*a;*
FIG. 5*c* is a diagram showing the essential portion of the reflected portion of the determined room impulse response according to FIG. 5*a;*
FIG. 5*d* is a diagram showing the essential portion of a second reflection from the determined room impulse response according to FIG. 5*a;*
FIG. 5*e* is a diagram showing the essential portion of an even later reflection from the determined room impulse response according to FIG. 5*a;*

The appropriate time-dependent amplitude patterns are schematically illustrated in FIGS. 4*a* to 4*c* for the room impulse response h(n) and its division into the direct sound component d(n) and reverberation component r(n). After the time $T=N\ \tau$ has elapsed, the direct sound has reached the listening location, and after that only those contents have to be expected which result from reflections or from reverberation. As an explanation it should be added that, in a frequency-linear transmission system, the impulse response would only be composed of one first value; the schematically shown room impulse response is determined also in the range of the direct sound by the transfer function from the sound source to the entrance of the auditory meatus and is extended to several milliseconds, for example, because of reflections at the head and body.

The determined room pulse response divided into the two sound components d(n) and r(n) is now supplied to that electronic device 2 which extracts from the determined room impulse response the components which contain those characteristics of the listening room acoustics, of the sound field present in the listening room and the left and right outer ear transfer functions assignable to the listener, which after the convolution process with any chosen audio program guarantee the true simulation of the entire room-acoustic event. The extraction is carried out in accordance with criteria which are described further below. The extracted or reduced room impulse response h'(n) is convolved in a processor 3 with the signal s (n) of any selected audio program in order to form the signal. When the sound reproduction is correct at both ears of the listener, the listening result desired in accordance with the invention is achieved, i.e., the true simulation of a listening location in a certain listening room.

Figure 2:
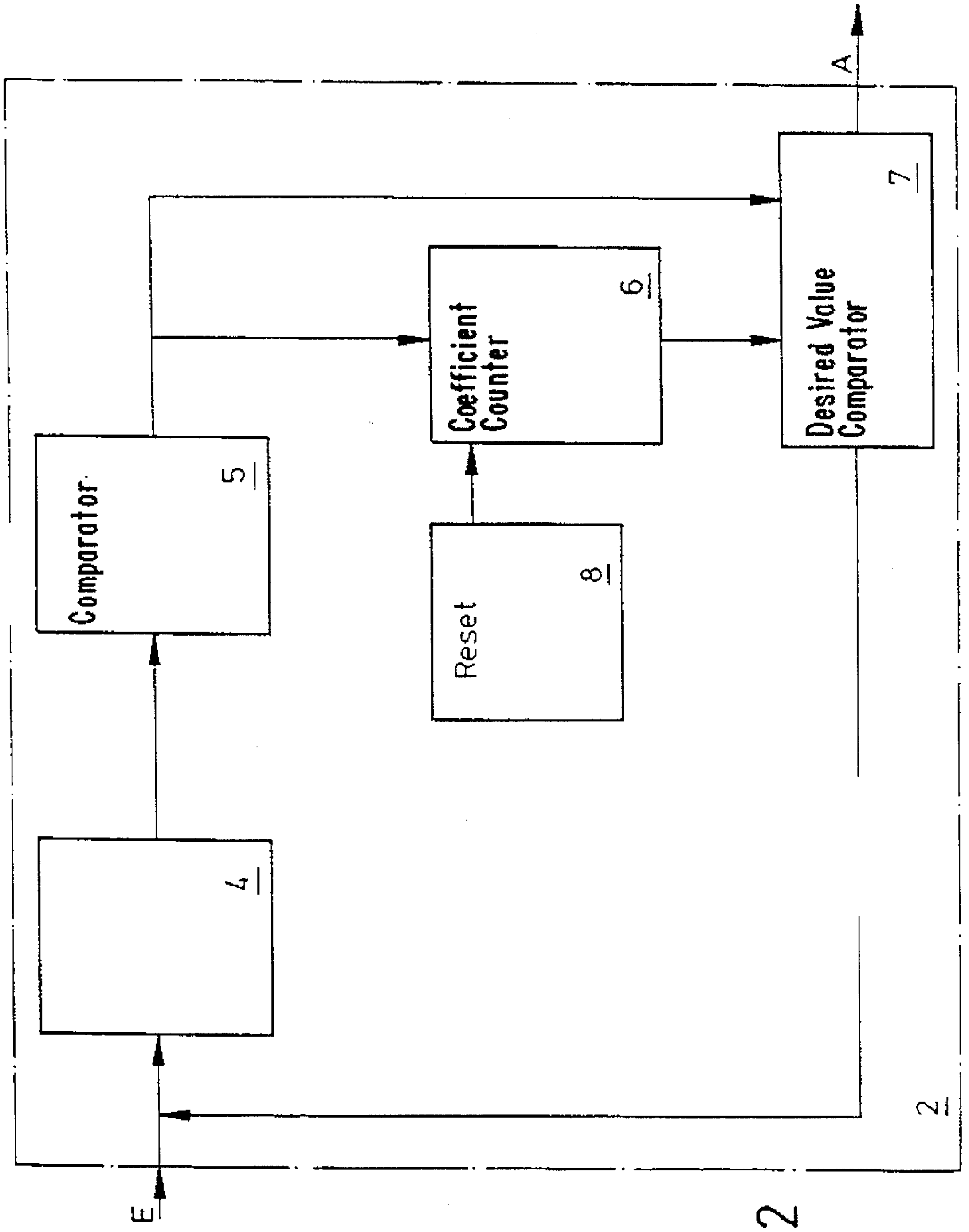
FIG. 2 is a diagram of the apparatus for selecting the essential portions from the determined room impulse response.

The extractor circuit 2 for selecting the significant components from the determined room impulse response is explained in more detail by the diagram of FIG. 2.

Because of the limited computational capacity of processor 3, it is advantageous to use only an early part of the respectively determined room impulse response. For this purpose, the room impulse response existing at an input E and divided into the components direct sound and reverberation sound is divided in a function block 4 into individual portions having the duration $T_i$.

FIGS. 5*a*–5*e* show how the determined room impulse response is divided by means of the function block 4 into individual blocks or portions $T_i$ having the sound components d(n), $r_2(n)$, $r_3(n)$ . . . $r_i(n)$.

The division into direct sound and reverberation sound is carried out because the direct component of the determined room impulse response should remain unchanged at least in studio applications and on the reverberation component is reduced as described. However, applications are conceivable in which both components of the determined room impulse response are reduced.

After the direct sound has been separated off, the remaining contents of the room impulse response, which in accordance with a criterion described below are below a predetermined threshold value, are set to zero by means of a comparator 5. The number of samples in the remaining signal components of the reduced room impulse response are counted in a coefficient counter 6. The obtained counter value is compared in a desired value comparator 7 to a limit value which is determined by the permissible computing effort. If the limit has not yet been exceeded, additional blocks of the determined room pulse response are called up in accordance with FIGS. 5*a*–5*e*. In this manner, the computing capacity is fully utilized in the case of a later convolution with the reduced room impulse response. When the predetermined desired value has been reached, the now existing reduced room impulse response is conducted to an output A.

Figure 3:
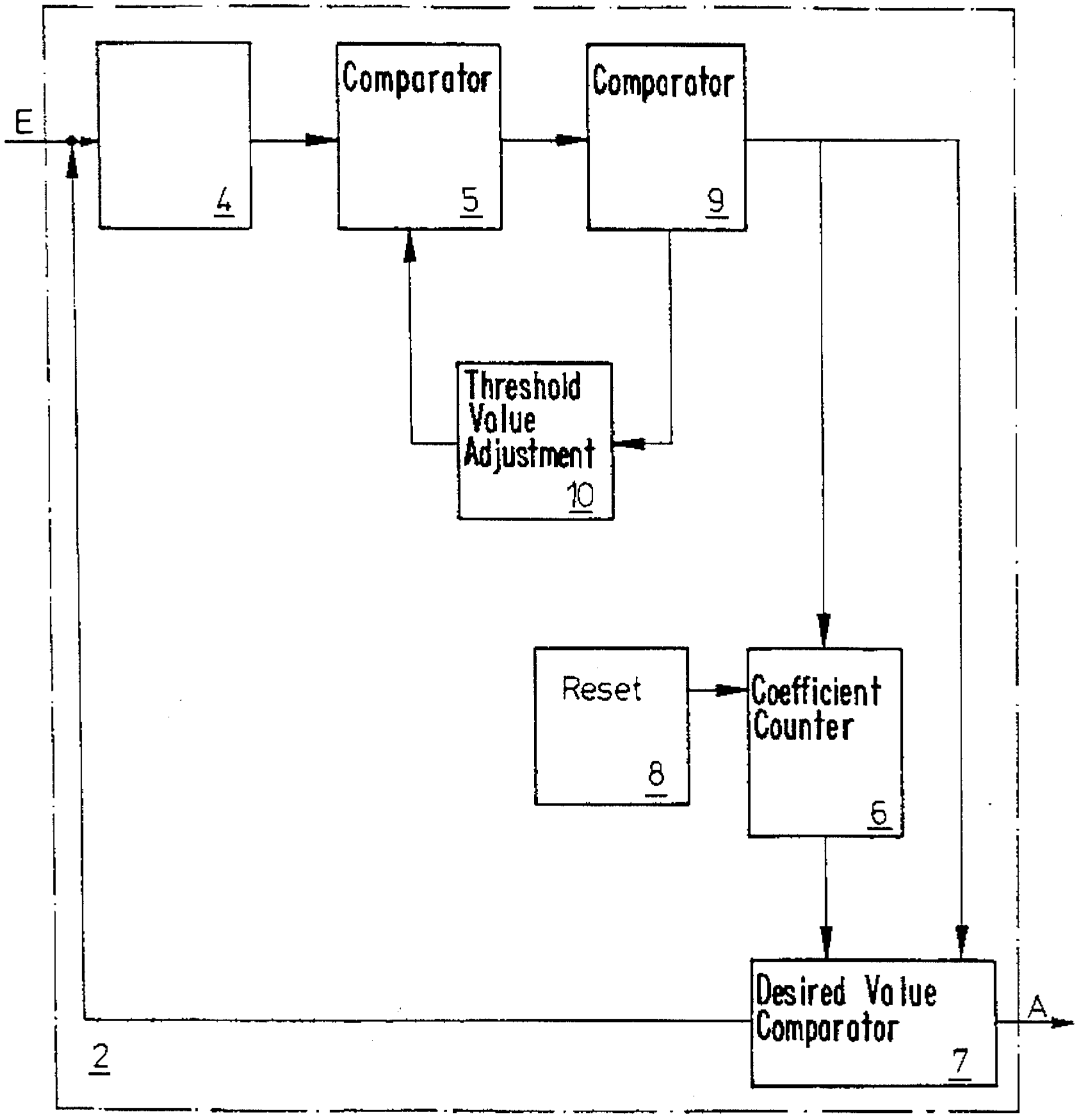
FIG. 3 is a diagram showing the apparatus for selecting the essential portions from the determined room impulse response by use of a changeable threshold value.

In the event that the critical signal evaluation of the determined room impulse response is carried out in accordance with a masking phenomenon, the arrangement illustrated in FIG. 3 is required for this purpose. Compared to the diagram shown in FIG. 2, a dynamic threshold value adjustment is added in FIG. 3. The dynamic threshold value adjustment is composed of a comparator 9 and a threshold value generator 10. In the comparator 9, the instantaneous value of the determined room impulse response is compared to the instantaneous threshold value, wherein the magnitude of the threshold value is dependent on the preceding values of the determined room impulse response in accordance with the masking phenomenon. Through the return via the threshold value generator 10 to the comparator 5, the dynamic adjustment is realized to the predetermined psychoacoustic criteria in accordance with the masking phenomenon, for example, in accordance with Zwicker.

Figures 6A, 6B:
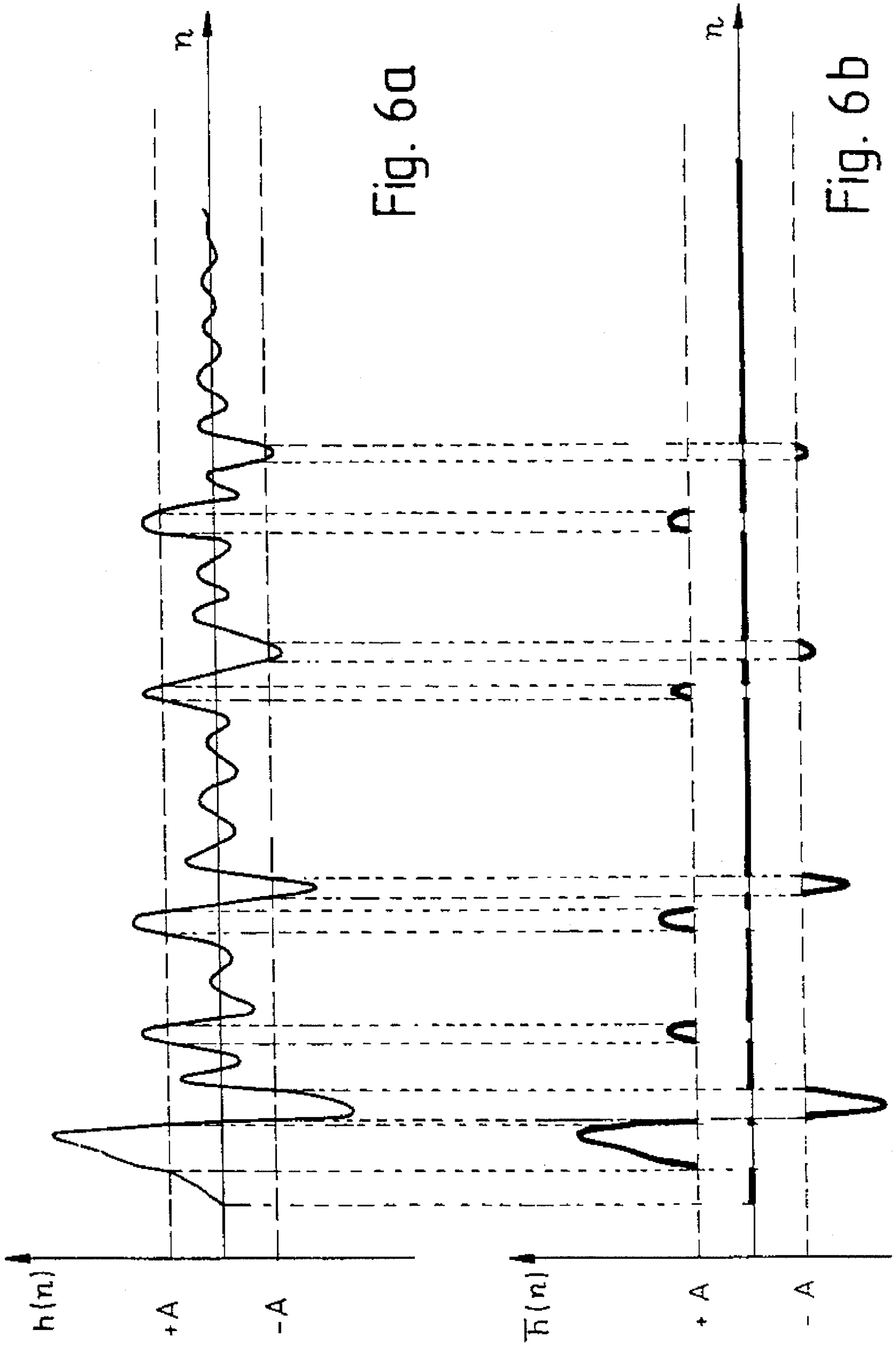
FIG. 6*a* is a diagram showing the determined room impulse response with superimposed threshold values.
FIG. 6*b* is a diagram showing the reduced room pulse response from the determined room impulse response according to FIG. 6*a;*

As illustrated in FIGS. 6*a* and 6*b*, the critical selection of the signal contents of the determined room impulse response essential for the simulation can be effected by setting to zero all those contents of the determined room impulse response which are below a predetermined fixed threshold value A, so that these contents are not taken into consideration in the later convolution process, while the signal contents exceeding the threshold value are included with unchanged amplitude in the reduced room impulse response. Since there is a direct relationship between the intensity of the sound reflections and the samples of the determined room impulse response corresponding to these reflections, the threshold value criterion constitutes a significant aid in extracting the samples of the determined room impulse response which are essential for the simulation. When convolution is carried out, only the essential features resulting from the selection criterion are taken into consideration from the determined room impulse response, so that the necessary computing effort is substantially reduced. While $25\times10^6$ multiplications and additions can be carried out by the signal processor in the case of a FIR-filter, which corresponds in the case of a sampling interval of 20 μsec to 500 filter coefficients and 10 millisecond impulse response duration, the use of the reduced room impulse response enables the processor to simulate three rooms simultaneously, wherein the reverberation times are up to 1 second.

Figures 7A, 7B:
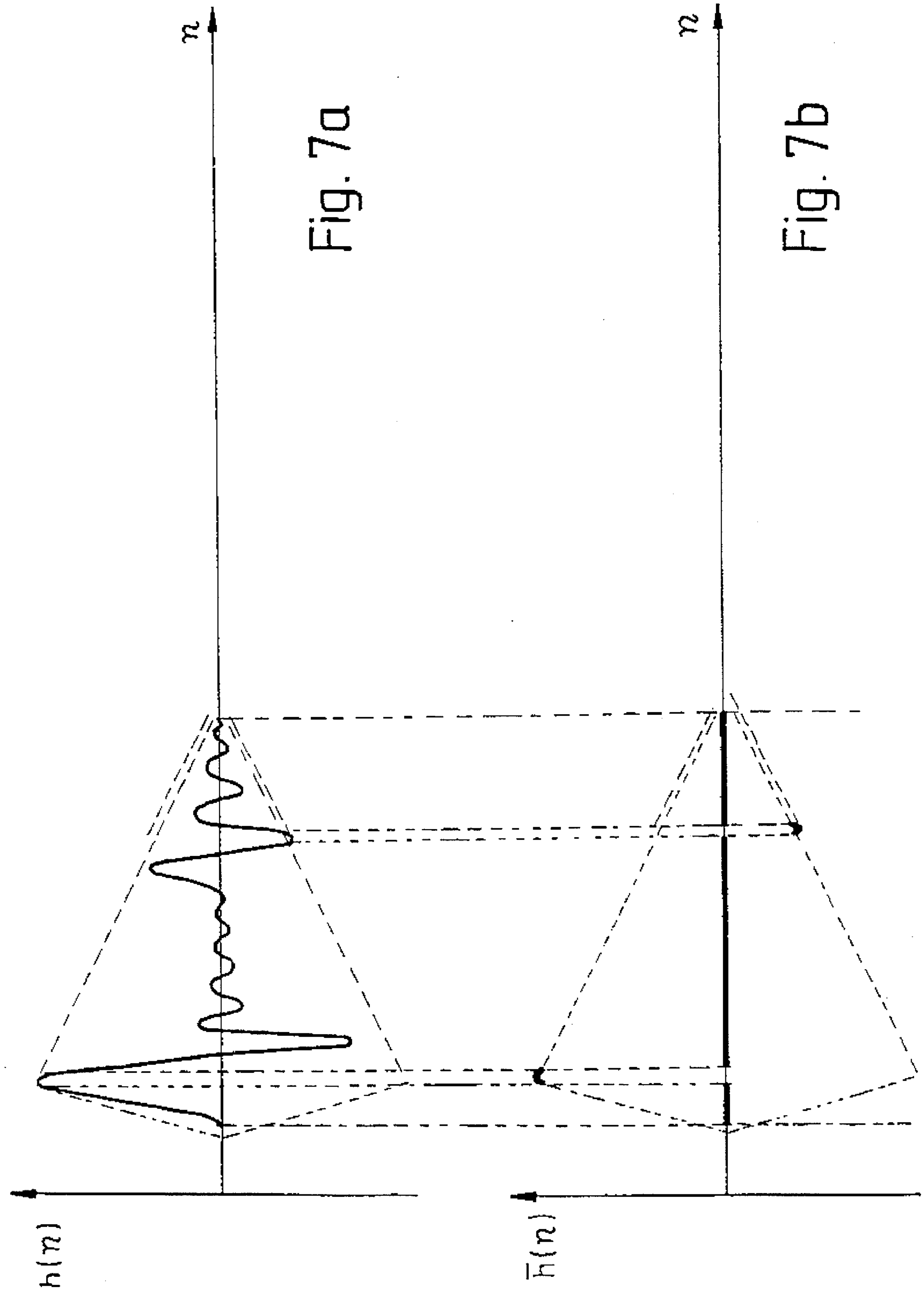
FIG. 7*a* is a diagram showing a determined room impulse response with superimposed threshold values taking into consideration the masking phenomenon.
FIG. 7*b* is a diagram showing the reduced room impulse response from the determined room impulse response according to FIG. 7*a;*

Finally, as illustrated in FIGS. 7*a* and 7*b*, the critical selection can also be carried out pursuant to criteria in accordance with masking phenomena. In accordance with these phenomena, those contents of the determined room impulse response do not have to be taken into consideration which are not perceivable during listening anyway. In accordance with the information which is present, the masked contents are to be excluded from the convolution process which is carried out later. In that case, it is also no longer necessary to distinguish between direct sound and reverberation component rather, the entire determined room impulse response can be reduced from the beginning as described above.

$T_v$ designates the areas of forward-masking and $T_N$ designates the areas of backward-masking. These are the periods in which signals below a level limit, as they are sketched in FIG. 7*a*, are no longer perceivable compared with the principal signal. As described in the standard literature concerning this topic, the masking effects are dependent on the time spacing, on the level ratio and the frequency spacing of masked signal and masking signal. Consequently, this cannot be completely illustrated in the drawing. The room impulse response primarily influences the time conditions and level conditions. Accordingly, it is always necessary to use somewhat wider value ranges of the determined room impulse response than would result directly from the boundary line criterion. In addition, in order not to obtain undesirable filter effects in the frequency range, it is necessary to extrapolate value ranges into the actually masking range.

Figure 8A:
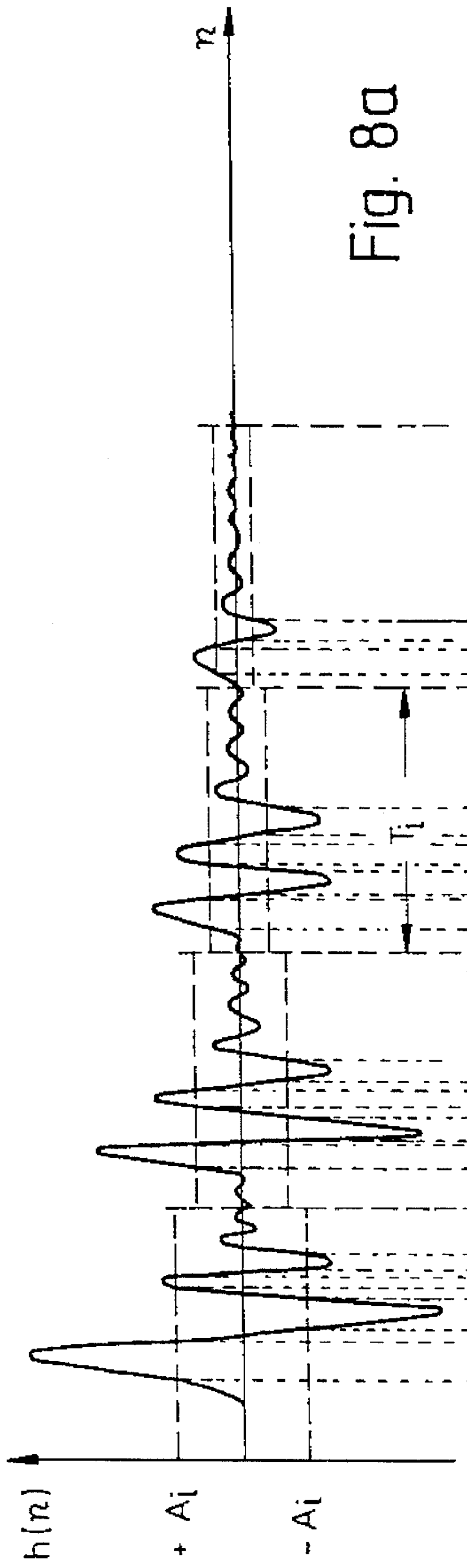
FIG. 8*a* is a diagram showing a determined room impulse response with superimposed threshold values which decrease in a step-like manner.
Figure 8B:
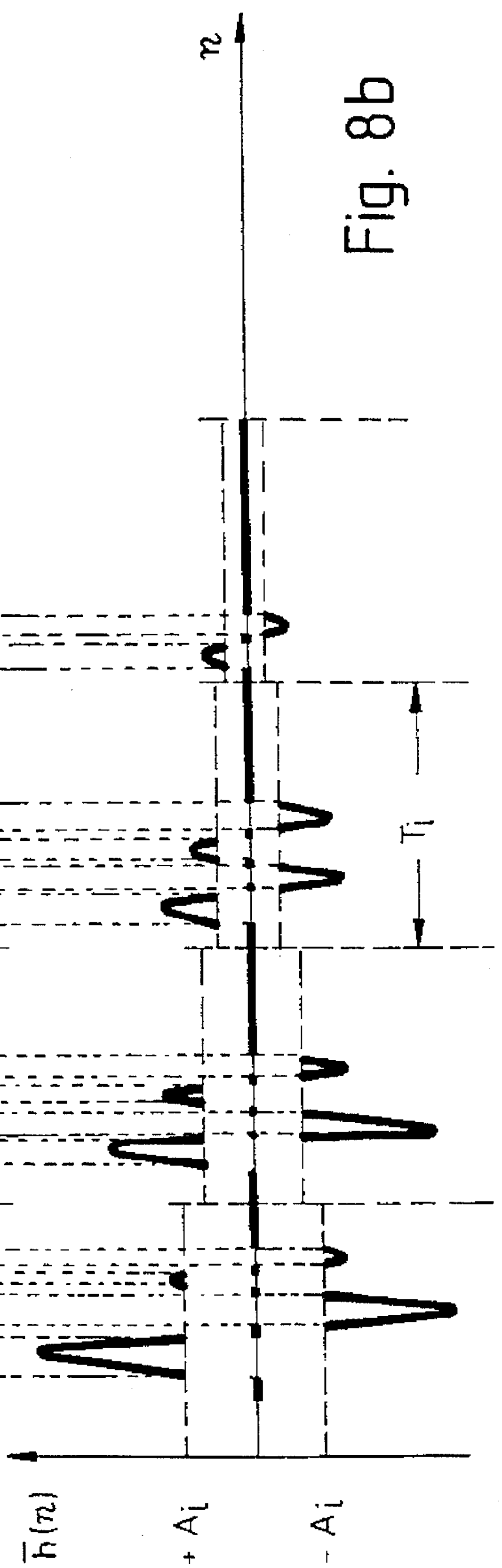
FIG. 8*b* is a diagram showing the reduced room impulse response from the room impulse response according to FIG. 8*a;*

FIGS. 8*a* and 8*b* illustrate how the threshold value decreases in a step-like manner and how the signal contents are determined for the simulation.

Figure 9:
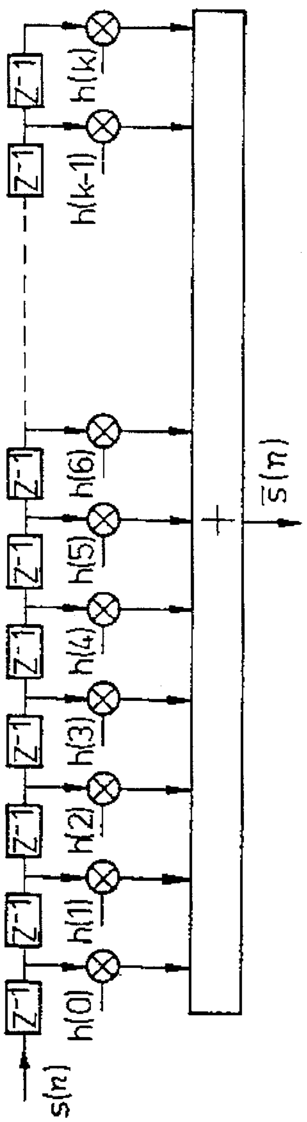
FIG. 9 is a schematic illustration of a conventional transversal filter or FIR filter.

FIG. 9 of the drawing shows the possible architecture of a conventional FIR-filter. In the chain of stack memories $z^{-1}$, each of which stores a signal value for a sampling interval, a signal value is taken in each sampling interval at each connection and is multiplied with the filter coefficient corresponding to this location; the result is added in an adder to all other results and is conducted to the output, and, thus, represents the direct implementation of convolution on a processor. Depending on the technological conditions of the processor 3, this convolution procedure can of course also be carried out in other conjugated structures, so that the computing effort can be reduced. However, in principle, the procedures are always an optimum sequence with respect to time of the additions and multiplications, so that, in the best case, a factor of two to three can be gained in computing effort.

Figure 10:
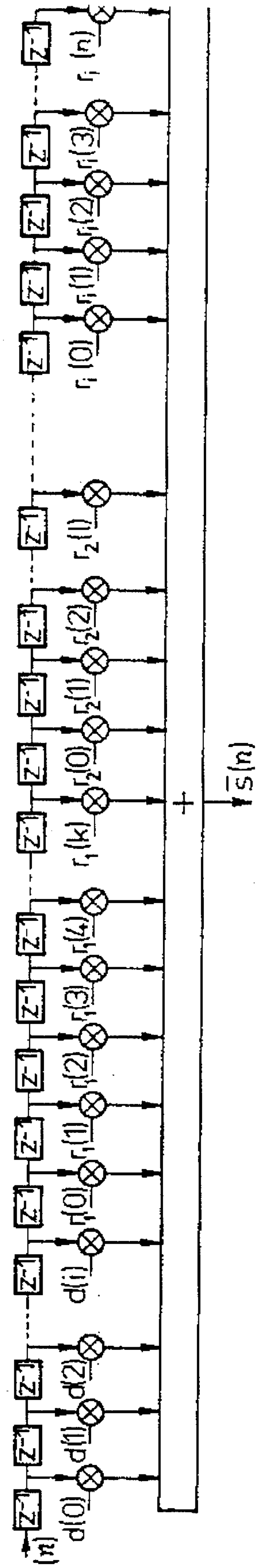
FIG. 10 is a schematic illustration of the structure of an FIR filter resulting from the invention for the convolution process with reduced room impulse response according to the invention.

FIG. 10 of the drawing shows how the architecture of the FIR-filter is modified if the convolution procedure is carried out with the extracted room impulse response.

In that case, the successive samples of the remaining signal contents of the room impulse response form the filter coefficients $d_j$, $r_{1k}$, $r_{2l}$, $r_{3m}$, $r_{in}$. These are the coefficients which, corresponding to the designations in the example of FIG. 5, are of significant importance for the true simulation. The number of all filter coefficients is lower by one to two orders of magnitude than the number of stack memory positions. Since the filter coefficients now no longer occur with equal spacing with respect to time, the delay time or the number of the sample is reported to the filter processor simultaneously with a filter coefficient.

Compared to the filter illustrated in FIG. 9, the number of computing operations required for a result which is evaluated as equal in the perception of the listener which is smaller by 1 to 2 orders of magnitude while the filter length is the same.

The invention is not limited by the embodiments described above which are presented as examples only but can be modified in various ways within the scope of protection defined by the appended patent claims.

I claim:

1. A method of simulating a room impression and/or sound impression occuring at a representative listening location in a room with one of monophonic, stereophonic and multichannel reproduction, the method comprising the steps of:

selecting a room whose sound is to be simulated;

determining within the room a location of a representative listening location;

determining at the representative listening location a corresponding room impulse response at least for one channel;

determining for the determined room impulse response a threshold value which extends over at least a portion of the duration of the determined room impulse response; and by comparing the determined room impulse response with the threshold value, producing a reduced room impulse response which within the portion of the duration of the determined room impulse response only includes those contents of the determined room impulse response in which a momentary amplitude is above the threshold value, while setting the reduced room impulse response to the value zero for those contents of the determined room impulse response whose momentary amplitude is below the threshold value, and which outside of the portion of the duration of the determined room impulse response contains the determined room impulse response in unchanged form.

2. The method according to claim 1, wherein, with the exception of a range of the determined room impulse response corresponding to direct sound, the portion of the duration of the determined room impulse response includes the entire remaining duration of the determined room impulse response.

3. The method according to claim 1, wherein the portion of the duration of the determined room impulse response includes the entire duration of the determined room impulse response.

4. The method according to claim 1, wherein the threshold value is a dynamically changeable threshold value which includes a fixed predetermined minimum value, further comprising raising the threshold value toward a greater valid threshold value by a semi-oscillation of the determined room impulse response which exceeds the valid threshold value or the fixed predetermined minimum value, and, after raising the threshold value, allowing the threshold value to drop gradually to the fixed predetermined minimum value.

5. The method according to claim 4, wherein the threshold value drops in accordance with an exponential function.

6. The method according to claim 4, comprising determining the threshold value in accordance with a psychoacoustic masking phenomenon.

7. The method according to claim 1, wherein the threshold value is a fixed threshold value.

8. The method according to claim 1, wherein the threshold value is changeable in a step-like manner.

9. The method according to claim 1, wherein the selected room is one of a theoretical and virtual room, further comprising determining the room impulse response as a computed room impulse response in accordance with at least one of a room configuration, a sound source location, the listening location, a direction of the sound source and a head alignment.

10. The method according to claim 1, wherein the selected room is a room existing in reality, further comprising measuring the determined room impulse response in the real room.

11. The method according to claim 1, comprising carrying out the method for at least two different listening channels.

12. The method according to claim 1, comprising convolving an audio signal with the reduced room impulse response.

13. An apparatus for simulating a room impression and/or sound impression occurring at a representative listening location in a room, comprising means for determining at the representative listening location a corresponding room impulse response at least for one channel, for determining for the determined room impulse response a threshold value which extends over at least a portion of the duration of the determined room impulse response and, by comparing the determined room impulse response to the threshold value, for producing a reduced room impulse response which within the portion of the duration of the determined room impulse response only includes those contents of the determined room impulse response in which a momentary amplitude is above the threshold value while setting the reduced room impulse response to the value zero for those contents of the determined room impulse response whose momentary amplitude is below the threshold value, and which outside of the portion of the duration of the determined room impulse response contains the determined room impulse response in unchanged form, further comprising an electronic circuit having programmed therein the reduced room impulse response obtained by said means, the circuit comprising at least one input for feeding in one of a monophonic, a stereophonic and a multichannel audio program, at least one channel and for each channel at least one audio output for outputting a Processed audio program obtained by convolving the fed-in audio program with the reduced room impulse response for each channel.

14. The apparatus according to claim 13, comprising for each channel at least one FIR filter having filter coefficients corresponding to amplitude values of the reduced room pulse response which is digitalized with a predetermined sampling frequency.

* * * * *

UNITED STATES PATENT AND TRADEMARK OFFICE

CERTIFICATE OF CORRECTION

PATENT NO. : 5,544,249

DATED : August 6, 1996

INVENTOR(S) : Martin Opitz

It is certified that error appears in the above-indentified patent and that said Letters Patent is hereby corrected as shown below:

On the title page, item:

[30] Foreign Application Priority Data

Aug. 26, 1993 [DE] Germany .......... 43 28 620.8

Signed and Sealed this

Twenty-eighth Day of January, 1997

Attest:

BRUCE LEHMAN

*Attesting Officer* *Commissioner of Patents and Trademarks*

UNITED STATES PATENT AND TRADEMARK OFFICE

CERTIFICATE OF CORRECTION

PATENT NO. : 5,544,249

DATED : August 6, 1996

INVENTOR(S) : Martin Opitz

It is certified that error appears in the above-indentified patent and that said Letters Patent is hereby corrected as shown below:

On title page, item [73] assignee, should read as follows:

[73] Assignee: AKG Akustische U. Kino-Geräte Gesellschaft m.b.H., Vienna, Austria Signed and Sealed this Twenty-second Day of April, 1997

Attest:

BRUCE LEHMAN

*Commissioner of Patents and Trademarks*

*Attesting Officer*